US010476028B2

United States Patent
Huang

(10) Patent No.: US 10,476,028 B2
(45) Date of Patent: Nov. 12, 2019

(54) PACKAGING STRUCTURE, A DISPLAY DEVICE AND A PACKAGING METHOD OF AN OLED DEVICE

(71) Applicant: BOE TECHNOLOGY GROUP CO., LTD., Beijing (CN)

(72) Inventor: Wei Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 49 days.

(21) Appl. No.: 15/326,097

(22) PCT Filed: Jul. 28, 2016

(86) PCT No.: PCT/CN2016/092016
§ 371 (c)(1),
(2) Date: Jan. 13, 2017

(87) PCT Pub. No.: WO2017/117982
PCT Pub. Date: Jul. 13, 2017

(65) Prior Publication Data
US 2018/0040850 A1 Feb. 8, 2018

(30) Foreign Application Priority Data
Jan. 4, 2016 (CN) .......................... 2016 1 0003711

(51) Int. Cl.
*H01L 51/52* (2006.01)
*H01L 51/56* (2006.01)
(Continued)

(52) U.S. Cl.
CPC .......... *H01L 51/5253* (2013.01); *H01L 23/16* (2013.01); *H01L 23/3135* (2013.01);
(Continued)

(58) Field of Classification Search
CPC .... H01L 23/16; H01L 51/50–56; H01L 51/52
See application file for complete search history.

(56) References Cited

U.S. PATENT DOCUMENTS

2003/0164674 A1* 9/2003 Imamura ................ H05B 33/04
  313/493
2015/0280071 A1   10/2015 Takenaga et al.
2015/0380685 A1* 12/2015 Lee ..................... H01L 51/5243
  257/40

FOREIGN PATENT DOCUMENTS

CN   101488519 A   7/2009
CN   103456608 A   12/2013
(Continued)

OTHER PUBLICATIONS

Office Action from corresponding Chinese Application No. 201610003711.3, dated Jan. 3, 2017 (9 pages).
(Continued)

*Primary Examiner* — Marvin Payen
(74) *Attorney, Agent, or Firm* — Harness, Dickey & Pierce, P.L.C.

(57) ABSTRACT

The present disclosure relates to a packaging structure of an OLED device, a display device, and a packaging method of an OLED device. The packaging structure of an OLED device comprises: a substrate, an OLED device on the substrate, a first layer on the OLED device, wherein, the packaging structure of the OLED device further comprises a first blocking layer positioned outside the first layer for defining the first layer, and wherein the first blocking layer has a margin portion in its corner position.

20 Claims, 3 Drawing Sheets

(51) Int. Cl.
  *H01L 23/16*  (2006.01)
  *H01L 23/31*  (2006.01)
  *H01L 27/32*  (2006.01)
  *H01L 51/00*  (2006.01)

(52) U.S. Cl.
  CPC ...... *H01L 27/3244* (2013.01); *H01L 51/0097* (2013.01); *H01L 51/52* (2013.01); *H01L 51/5246* (2013.01); *H01L 51/5256* (2013.01); *H01L 51/56* (2013.01); *H01L 2251/5338* (2013.01); *Y02E 10/549* (2013.01)

(56) References Cited

FOREIGN PATENT DOCUMENTS

| | | |
|---|---|---|
| CN | 104103665 A | 10/2014 |
| CN | 104538558 A | 4/2015 |
| CN | 105449118 A | 3/2016 |
| KR | 20150036943 A | 4/2015 |

OTHER PUBLICATIONS

Written Opinion of the International Searching Authority from corresponding PCT Application No. PCT/CN2016/092016, dated Sep. 30, 2016 (5 pages).

\* cited by examiner

PACKAGING STRUCTURE, A DISPLAY DEVICE AND A PACKAGING METHOD OF AN OLED DEVICE

CROSS-REFERENCES TO RELATED APPLICATIONS

This application claims the benefit and priority of Chinese Patent Application No. 201610003711.3, filed on Jan. 4, 2016, the entire content of which is incorporated by reference herein.

FIELD OF THE DISCLOSURE

The present disclosure relates to the field of organic light emitting display technology, and particularly, to the field of active matrix light emitting diode technology. More particularly, the present disclosure relates to a packaging structure of an OLED device, a display device, and a packaging method of an OLED device.

BACKGROUND

Compared to other types of display devices (eg, liquid crystal display units), OLED display devices have been studied broadly and are used preliminarily as next-generation displays because of their advantages of light weight, low power consumption, high contrast and high color gamut. Another advantage of OLED display devices is that they do not require backlighting, as compared to liquid crystal display devices.

One drawback of OLED display devices, however, is their sensitivity to air and humidity. Most organic substances in the OLED light emitting layer are sensitive to pollutants, O2 and water vapor in the atmosphere, and will directly cause problems such as deterioration of organic light emitting materials, low light emitting efficiency, abnormal light emission or being unable to emit light, etc., and meanwhile cause oxidation and corrosion of metal electrodes, so the packaging technology directly affects the stability and life of the OLED display device.

Active-matrix organic light emitting diodes (AMOLEDs) are more energy-efficient than passive-matrix organic light emitting diodes (PMOLED). Active-matrix light emitting diode has a good market prospect, but its packaging technology is also the key technology of AMOLED display products, and currently many display panel manufacturers are developing the film encapsulation (TFE) technology. TFE structure is generally a multi-layer film stack structure with two or more layers, which are divided into two types according to the function, inorganic water blocking layer and organic planarization planarization layer. FIGS. 1A and 1B are typical three-layer, five-layer film stack TFE structures.

BRIEF SUMMARY OF THE DISCLOSURE

An embodiment of the present disclosure provides an packaging structure, a display device and an packaging method for an OLED device, which can solve the problem that the uniformity of films in the prior art packaging technology is poor and there are high requirements for the manufacturing equipment.

One object of the present disclosure is to provide an packaging structure of an OLED device.

A first aspect of the present disclosure provides an packaging structure of an OLED device, comprising: a substrate, an OLED device on the substrate, a first layer on the OLED device, wherein the packaging structure of the OLED device further comprises a first blocking layer positioned outside the first layer for defining the first layer, and wherein the first blocking layer has a margin portion in its corner position.

In one embodiment, the maximum half length of the margin portion of the first blocking layer is about 0.03 mm-0.3 mm.

Alternatively, the maximum half length of the margin portion of the first blocking layer is about 0.05 mm-0.15 mm.

In one embodiment, the first layer has a first slope shape at a position corresponding to the corner of the OLED device and a second slope shape at a position corresponding to the edge of the OLED device, and wherein the width of the first slope shape is greater than the width of the second slope shape and the difference in width is in the range of about 0.03 mm-0.3 mm.

Alternatively, the difference between the width of the first slope shape and the width of the second slope shape is in the range of about 0.05 mm-0.15 mm.

In one embodiment, the packaging structure further comprises a first water blocking layer disposed between the OLED device and the first layer, and a second water blocking layer disposed on the first layer.

Alternatively, at least one of the first layer, the first water blocking layer, and the second water blocking layer has a margin portion in its corner position.

Alternatively, the shape of at least one of the margin portion of the first blocking layer, the margin portion of the first layer, the margin portion of the first water blocking layer and the margin portion of the second water blocking layer comprises an arc, a semicircle, a rectangle and a square.

Alternatively, the packaging structure further comprises at least one second layer and at least one third water blocking layer disposed alternately with each other, and further comprises at least one second blocking layer positioned outside the second layer for defining the second layer.

Wherein the substrate is a flexible substrate; the OLED device is an AMOLED device; the first and second water blocking layers are inorganic water blocking layers; the first layer is an organic planarization layer.

Another object of the present disclosure is to provide a display device.

A second aspect of the present disclosure provides a display device provided with the foregoing packaging structure of the OLED device.

A further object of the present disclosure is to provide an packaging method of an OLED device.

A third aspect of the present disclosure provides an packaging method of an OLED device, comprising: providing a substrate; disposing an OLED device on the substrate; forming a first layer on the OLED device by an inkjet process; wherein the method further comprises forming a first blocking layer outside the first layer for defining the first layer, and providing a margin portion at a corner position of the first blocking layer.

In one embodiment, the packaging method further comprises setting a maximum half length of the margin portion of the first blocking layer to about 0.03 mm-0.3 mm.

Alternatively, the packaging method further comprises setting a maximum half length of the margin portion of the first blocking layer to about 0.05 mm-0.15 mm.

In one embodiment, the first layer is arranged to have a first slope shape at a position corresponding to the corner of the OLED device and to have a second slope shape at a position corresponding to the edge of the OLED device; and wherein the width of the first slope shape is set greater than the width of the second slope shape and the difference in width is set in a range of about 0.03 mm-0.3 mm.

Alternatively, the difference between the width of the first slope shape and the width of the second slope shape is set in a range of about 0.05 mm-0.15 mm.

Alternatively, the packaging method further comprises: forming a first water blocking layer between the OLED device and the first layer; and forming a second water blocking layer on the first layer.

Alternatively, at least one of the first layer, the first water blocking layer, and the second water blocking layer is provided with a margin portion in its corner position.

Alternatively, the shape of at least one of the margin portion of the first blocking layer, the margin portion of the first layer, the margin portion of the first water blocking layer and the margin portion of the second water blocking layer comprises an arc, a semicircle, a rectangle and a square.

Alternatively, the packaging method further comprises at least one second layer and at least one third water blocking layer disposed alternately with each other, and further comprises providing at least one second blocking layer positioned outside the second layer for defining the second layer.

Alternatively, the substrate is a flexible substrate; the OLED device is an AMOLED device; the first and second water blocking layers are inorganic water blocking layers; the first layer is an organic planarization layer.

The packaging structure, the display device, and the packaging method provided by the embodiments of the present disclosure, by providing the first blocking layer for defining the first layer outside the first layer, the first blocking layer having a margin portion at its corner position, can effectively deposit the film of various thickness, the prepared film has good uniformity, with less requirements for the manufacturing equipment.

BRIEF DESCRIPTION OF THE DRAWINGS

In order to more clearly illustrate the technical solution of embodiments of the present disclosure, the drawings of the embodiments will be briefly described below. It should be understood that the drawings described below merely relate to some embodiments of the present disclosure but are not intended to limit the present disclosure, in which FIG. 1 (a) and FIG. 1 (b) are schematic cross-sectional views of a typical TFE structure.

DETAILED DESCRIPTION

In order that objects, technical solutions and advantages of embodiments of the present disclosure will become more apparent, the technical solutions of the embodiments of the present disclosure will be clearly and completely described below with reference to the accompanying drawings. Obviously, the described embodiments are a part of the embodiments of the present disclosure, but not all embodiments. Based on the described embodiments of the present disclosure, all other embodiments obtained by those skilled in the art without the need for creative work fall within the scope of the present disclosure.

When describing elements of the disclosure and their embodiments, the articles "a," "an," "this" and "the" are intended to indicate the presence of one or more elements. Words "contain", "comprise", "have" and "with" are intended to be inclusive and mean that additional elements other than the listed elements may be present. As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

For the purpose of the following description of the surface, as in the direction in which they are marked, the terms "upper", "lower", "left", "right", "vertical", "horizontal", "top", "bottom" and their derivatives shall relate to the disclosure. The terms "overlying", "on top of", "positioned on", or "positioned on top of" means that a first element, such as a first structure, is present on a second element, such as a second structure, wherein an intermediate element such as an interface structure may exist between the first element and the second element. The term "contact" means connecting a first element, such as a first structure, and a second element, such as a second structure, with or without other elements at the interface of the two elements. As used herein, "about" or "approximately" is understood to refer to a number within a range of numbers. This range takes into account reasonable errors due to factors such as equipment. Furthermore, the range of all numerical values herein is to be understood as being inclusive of all or a part of all integers within the range.

Figure 1:
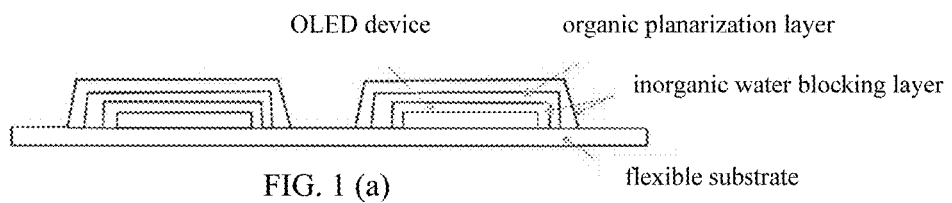
Figure 1:
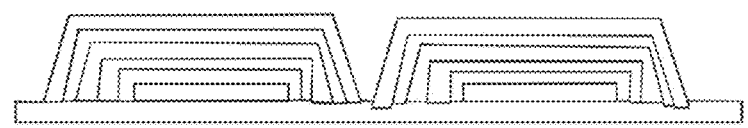

FIGS. 1A and 1B show a typical three-layer and five-layer film stack TFE structure.

Inorganic films have very high water vapor blocking capacity and are commonly used as water blocking layers. However, defects (pinholes, cracks) and the like are generated in the process of forming the films, reducing the ability to block the air. Too much or too thick inorganic layer will have a greater internal stress, affecting the quality of the packaging. The main function of the organic planarization layer is to provide planarized film deposition conditions for the subsequent inorganic water blocking layer and to provide excellent particle cladding effects. The way of staggering organic layer and inorganic layer may reduce the defects and stresses of the inorganic film layer.

Existing processes for depositing a planarization layer generally include vapor deposition, screen printing, and the like. However, there is a problem that the film uniformity is poor. The film uniformity is in view of the film thickness, and generally calculated by the film uniformity coefficient= (Max−Min)/(Max+Min). The film uniformity coefficient calculated according to the conventional deposition process of the planarization layer is generally 60% to 90%. Uneven thickness of the planarization layer tends to produce weak points in the topography or film stress, resulting in failure of the packaging of the water blocking layer deposited thereon.

In embodiments of the present disclosure, the planarization layer is preferably deposited using inkjet printing. Compared with other conventional processes for depositing the planarization layer, inkjet printing has the advantages of high deposition rate, good uniformity and low equipment investment.

When depositing a planarization layer, the film thickness of the planarization layer is different at different positions. Specifically, the film thickness of the planarization layer at the position corresponding to the corner of the OLED device is greater than the film thickness of the planarization layer at the position corresponding to the edge of the OLED device. This is because more ink drops are integrated at the corner. This will reduce the film performance and affect the packaging effect of the structure. With an expensive inkjet printer having complex functions and employing inkjet graphics editing algorithm, this problem can be avoided to a certain extent, but manufacturing costs are increased.

Figure 2:
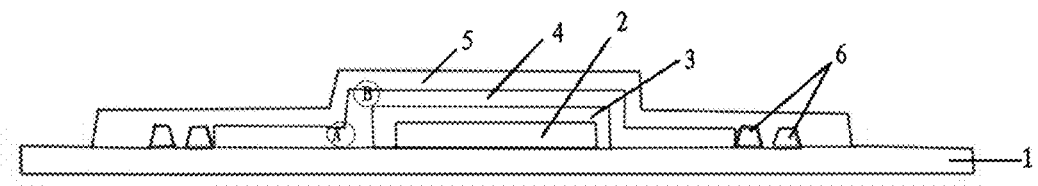
FIG. 2 is a schematic cross-sectional view of a structure according to one embodiment of the present disclosure.

FIG. 2 is a schematic diagram of an packaging structure of an OLED device according to one embodiment of the present disclosure. In the present embodiment, the inkjet graphics editing algorithm is not employed, thereby providing a method that has less requirements for the manufacturing equipment, and a lower manufacturing cost, and can produce a film with better performance.

It is to be noted that the description is made by example of the first layer is a planarization layer, rather than limiting the first layer to the planarization layer, which may also be other functional layer. The planarization layer will be exemplarily described below.

The inventor has noted that a "slope-climbing" phenomenon occurs when a planarization layer is deposited. That is, as shown in FIG. 2, the planarization layer has a slope shape between the A position and the B position in the figure. Here, the projection length of the slope shape of the planarization layer in the horizontal direction is called the width of the slope shape, which is also called the slope-climbing width (also as profile width). The projected length of the slope shape of the planarization layer in the vertical direction is called the height of the slope shape. The angle between the slope shape and the horizontal direction is called the angle of the slope shape.

The inventor has also noted that the width of the slope shape of the planarization layer at the position corresponding to the corner of the OLED device is also different from its width of the slope shape at the position corresponding to the edge of the OLED device. The slope shape of the planarization layer has an influence on the uniformity of the film and the performance of the packaging structure of the OLED device and it is therefore necessary to improve the slope shape of the planarization layer, in particular to improve the width of the slope shape of the planarization layer at the position corresponding to the corner of the OLED device and the width of the slope shape thereof at the position corresponding to the edge of the OLED device.

As shown in FIG. 2, an packaging structure of an OLED device according to an embodiment of the present disclosure comprises: a substrate (1), an OLED device (2) on the substrate, a first water blocking layer (3) on the OLED device, a first planarization layer (4) on the first water blocking layer, and a second water blocking layer (5) on the first planarization layer. Although only a three-layer film structure is shown in the figure, more stacks of the planarization layer and the water blocking layer may be continuously provided as necessary. Preferably, the packaging structure of the OLED device further comprises a first blocking layer (6) outside the planarization layer for defining the planarization layer. In one embodiment, the blocking layer is a backplane blocking layer, which will be exemplarily described below using the blocking layer as the backplane blocking layer.

The substrate may be any substrate used in the art, preferably a flexible substrate, including any material suitable for making a substrate, such as a high molecular polymer, metal foil, ultra-thin glass, or the like. The water blocking layer comprises a transparent inorganic material (e.g., oxides, fluorides, nitrides) and any other material suitable for blocking water and oxygen. The planarization layer comprises a polymer film and any other material suitable for making a planarization layer. The sealing performance of the device can be controlled by adjusting the number of layers and components of the water blocking layer and the planarization layer.

Ink used in the inkjet process has low viscosity, and in the case where the levelling agent control is not ideal enough, the ink will diffuse outward due to the effect of the surface energy or the impact of levelling time, not conducive for the design and production of narrow bezel display devices. In this regard, it is possible to add a blocking layer on the periphery of the display device, that is, a backplane blocking layer provided on the outside of the planarization layer for defining the planarization layer. The number of backplane blocking layers may be set as desired. As shown in FIG. 2, two backplane blocking layers may be provided. That is, the first backplane blocking layer (6) comprises two blocking layers, and the top view of the first backplane blocking layer may be in a "囗" shape. However, it is also possible to provide one backplane blocking layer, the top view of which may be in a "ロ" shape.

In one embodiment, the distance from the backplane blocking layer to the slope shape (to the A position) of the planarization layer is about 0.5 mm. The distance from the backplane blocking layer to the slope shape of the planarization layer may be adjusted as required. The material of the backplane blocking layer comprises organic material and any other material suitable for making the blocking layer.

Figure 3:
FIGS. 3 (a), 3 (b) and 3 (c) are schematic diagrams showing a margin portion according to one embodiment of the present disclosure.
Figure 3:
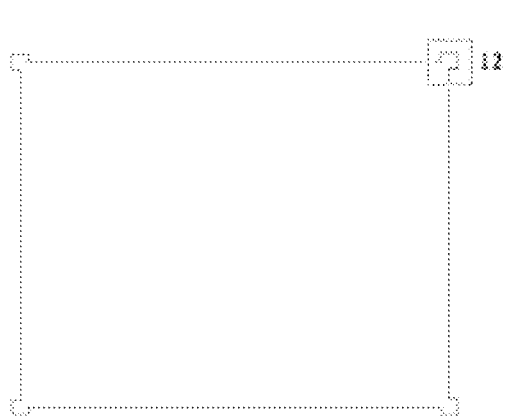
Figure 3:
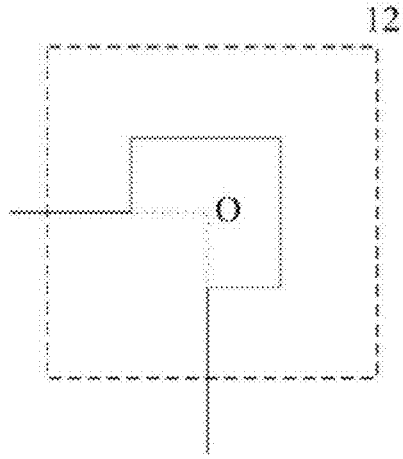

FIG. 3 (a) and FIG. 3 (b) show schematic diagrams of a margin portion according to an embodiment of the present disclosure. In some embodiments, the backplane blocking layer may have a shape as shown in FIG. 3, in which case the backplane blocking layer has a margin portion bulging outwardly in its corner position. That is, as shown in FIG. 3, the backplane blocking layer has margin portions (for example, the broken line portions 11 and 12 in the figure) in the corner positions as compared with the positions of the side edges thereof. The shapes of the margin portions include arcs, semicircles, rectangles, squares and the like, which are not limited to the shapes shown in FIGS. 3 (a) and 3 (b). The half of the maximum distance between any two points of a margin portion is called the maximum half length of the margin portion. For example, when the margin portion is a circle, the maximum half length is the radius of the circle, and when the margin portion is a square, the maximum half length is half of the diagonal length of the square. The maximum half length range of the margin portion is preferably about 0.03-0.3 mm, more preferably about 0.05-0.15 mm. FIG. 3 (c) is a diagram showing a further embodiment, which further enlarges the broken line portions of FIG.

3 (b). As shown in FIG. 3 (c), the center of the margin portion and the vertex O of the corner of the blocking layer substantially coincide.

In some embodiments of the present disclosure, an array process is employed for the design and manufacturing of the backplane blocking layer, although other methods known to those skilled in the art may also be employed, the details of which are not repeated herein. In the case where the backplane blocking layer is formed using a mask, the mask pattern for the backplane blocking layer may be designed to have a margin portion at a corner position as shown in FIGS. 3 (a) and 3 (b). However, the shape of the margin portion is not limited to the case shown in the figure, and the margin portion at the corner position may be an arc, a semicircle, a rectangle, a square or the like. The maximum half length of the margin portion is preferably about 0.03-0.3 mm, more preferably about 0.05-0.15 mm.

With the backplane blocking layer of the embodiments of the present disclosure, the slope shape of the planarization layer of the packaging structure of the OLED device may be defined. In particular, the width of the first slope shape of the planarization layer at a position corresponding to the corner of the OLED device may be set larger than the width of the second slope shape of the planarization layer at a position corresponding to the edge of the OLED device, and the range of difference in width is about 0.03-0.3 mm. Preferably, the range of difference in width is about 0.05-0.15 mm.

Figure 4:
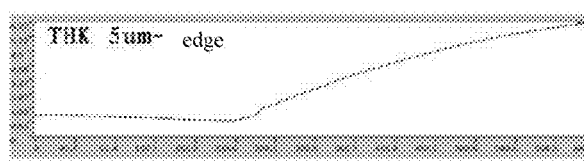
FIG. 4(a) and FIG. 4(b) are diagrams showing the slope shape of a planarization layer in an edge position and a corner position according to an embodiment of the present disclosure.
Figure 4:
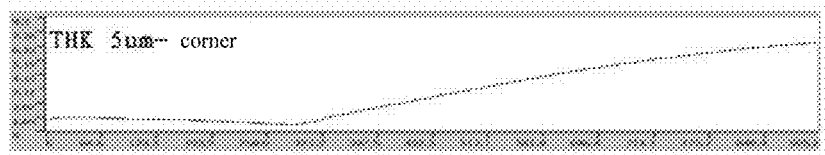
Figure 5:
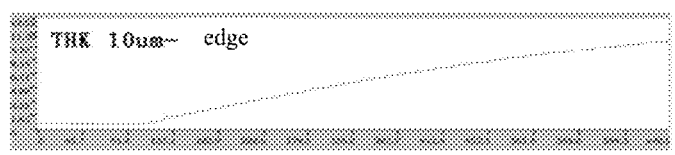
FIGS. 5 (a) and 5 (b) are diagrams showing the slope shape of a planarization layer in an edge position and a corner position according to another embodiment of the present disclosure.
Figure 5:
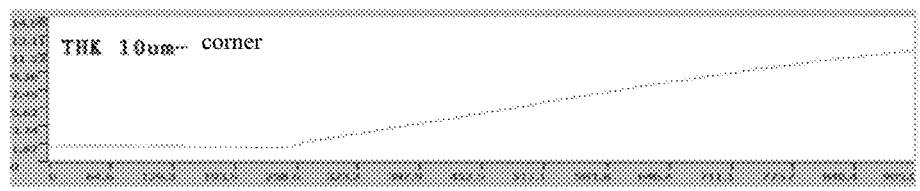

FIG. 4 and FIG. 5 are diagrams showing the slope shape of a planarization layer of different embodiments obtained with a 3D microscope, respectively. Herein, the ordinate represents the film thickness in μm. The abscissa represents the spatial position in the horizontal direction in FIG. 2, and the unit is μm. The thickness of the film can be measured by any device suitable for measuring the thickness, such as a-step, step-meter, 3D microscope, or the like. FIG. 4 shows the slope shape of the planarization layer at the edge position and the corner position when the planarization layer has a film thickness of about 5 μm. FIG. 5 shows the slope shape of the planarization layer at the edge position and the corner position when the planarization layer has a film thickness of about 10 μm.

It can be seen from FIGS. 4 and 5 that, the slope width of the planarization layer at its corner position (first slope width) is greater than the slope width at the edge position (second slope width) according to an embodiment of the present disclosure. However, the slope width of the planarization layer at the corner position and the slope width at the edge position thereof are not large, and the difference therebetween is not large either.

Embodiments of the present disclosure are further illustrated in Tables 1-4, which show width and angle according to the film thickness and the slope shape of different embodiments of the present disclosure.

TABLE 1

| Sample 1 | Measured Thickness (μm) | Width of Slope Shape (mm) | Angle of Slope Shape (°) |
| --- | --- | --- | --- |
| Corner | 5.53 | 0.58 | 0.357 |
| Edge | 5.15 | 0.51 | 0.531 |

TABLE 2

| Sample 2 | Measured Thickness (μm) | Width of Slope Shape (mm) | Angle of Slope Shape (°) |
| --- | --- | --- | --- |
| Corner | 9.42 | 0.65 | 0.740 |
| Edge | 8.98 | 0.52 | 0.935 |

TABLE 3

| Sample 3 | Measured Thickness (μm) | Width of Slope Shape (mm) | Angle of Slope Shape (°) |
| --- | --- | --- | --- |
| Corner | 12.47 | 0.65 | 0.934 |
| Edge | 12.52 | 0.57 | 1.184 |

TABLE 4

| Sample 4 | Measured Thickness (μm) | Width of Slope Shape (mm) | Angle of Slope Shape (°) |
| --- | --- | --- | --- |
| Corner | 16.68 | 0.62 | 1.494 |
| Edge | 17.88 | 0.55 | 1.772 |

As can be seen from Tables 1 to 4, for the four samples with different thicknesses of the planarization layer, the widths of the slope shapes at the corners are about 0.58 mm, 0.65 mm, 0.65 mm, and 0.62 mm, respectively, and the widths of the slope shape at the edges are about 0.51 mm, 0.52 mm, 0.57 mm and 0.55 mm, respectively. For the four samples, the difference between the width of the slope shape at the corner and the width of the slope shape at the edge is 0.07 mm, 0.13 mm, 0.08 mm, and 0.07 mm, respectively. The sample parameters in the tables are exemplary only, and in practice, a planarization layer with the range of the difference between the width of the slope shape at the corner and the width of the slope shape at the edge to be about 0.03 mm, 0.05 mm, 0.15 mm and 0.3 mm can be prepared.

It can be seen that the difference between the width of the slope shape of the planarization layer of the embodiment of the present disclosure and the width of the slope shape at the corner thereof and the difference between the width of the slope shape of the planarization layer of the embodiment of the present disclosure and the width of the slope shape at the edge are both relatively small.

In some embodiments of the present disclosure, a mask is used to complete the deposition of the water blocking layer, although other methods known to those skilled in the art may also be employed, the details of which are not repeated here.

In some embodiments of the present disclosure, the water blocking layer above or below the planarization layer may also have a margin portion. Alternatively, the maximum half length range of the margin portion is preferably about 0.03-0.3 mm, more preferably about 0.05-0.15 mm. The shape of the margin portion includes, but is not limited to, an arc, a semicircle, a rectangle and a square.

Figure 6:
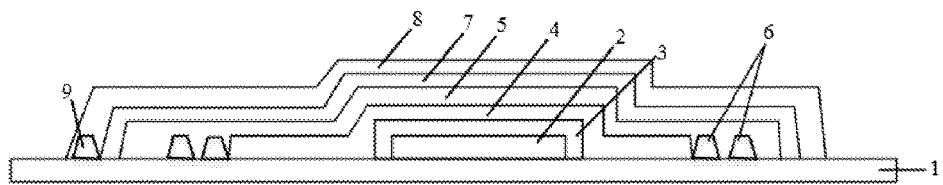
FIG. 6 is a schematic cross-sectional view of a structure according to another embodiment of the present disclosure.

Although FIG. 2 shows the case where there is only one planarization layer (first planarization layer 4), those skilled in the art will appreciate that more planarization layers may be provided as desired. In the case of a plurality of planarization layers, the device packaging structure further comprises at least one second planarization layer (see, e.g., layer 7 of FIG. 6) and at least one third water blocking layer (see, e.g., layer 8 of FIG. 6) disposed alternately. Preferably, it further comprises at least one second backplane blocking layer (see, e.g., layer 9 of FIG. 6) positioned on the outside of the second planarization layer for defining the second planarization layer.

In the case of a plurality of planarization layers, each stack of the planarization and water blocking layers and the margin portion of the corresponding blocking layer are larger in size than the stack of the planarization and water blocking layers and the corresponding margin portion of the blocking layer previously provided. Alternatively, the size difference is generally greater than 0.5 mm from the perspective of improving the reliability of the OLED packaging according to the alignment and manufacturing capabilities of existing devices.

Another embodiment of the present disclosure provides a display device provided with the packaging structure of the OLED device according to the embodiment of the present disclosure.

The embodiment of the present disclosure solves the problem that the slope width up to 2 mm of the slope shape of the film having a thickness of, for example, 5 m is too large, and causes the film thickness of the film is substantially the same at the corner and edge positions. Through measurement and calculation, it is found that in the embodiments of the present disclosure, the planarization film of different thickness can be effectively deposited with low manufacturing cost and low equipment requirement, the film is neat and smooth at edges, with good film uniformity, and its film uniformity coefficient 5%. Embodiments of the present disclosure are particularly suitable for flexible AMOLED display products with narrow bezels.

Certain particular embodiments have been described, which are presented by way of example only and are not intended to limit the scope of the disclosure. In fact, the novel embodiments described herein may be implemented in various other forms; furthermore, various omissions, substitutions, and alterations in the form of the embodiments described herein may be made without departing from the spirit of the disclosure. The appended claims and their equivalents are intended to cover such forms or modifications as falling within the scope and spirit of the disclosure.

What is claimed is:

1. A packaging structure comprising a substrate, an OLED device disposed on the substrate, a first layer disposed on the OLED device, and a first blocking layer positioned outside the first layer and defining the first layer, the first blocking layer including an extending portion located at its corner position and bulging outwardly relative to a portion of the first blocking layer that is not located at the corner position.

2. The packaging structure according to claim 1, wherein a maximum half-length of the extending portion of the first blocking layer is between about 0.03 mm and about 0.3 mm.

3. The packaging structure according to claim 2, wherein the maximum half-length of the extending portion of the first blocking layer is between about 0.05 mm and about 0.15 mm.

4. The packaging structure according to claim 1, wherein the first layer has a first slope shape at a position corresponding to a corner of the OLED device and a second slope shape at a position corresponding to an edge of the OLED device, wherein a width of the first slope shape is greater than a width of the second slope shape and wherein a difference between the width of the first slope shape and the width of the second slope shape is in a range from about 0.03 mm to about 0.3 mm.

5. The packaging structure according to claim 4, wherein the difference between the width of the first slope shape and the width of the second slope shape is in a range from about 0.05 mm to about 0.15 mm.

6. The packaging structure according to claim 1, further comprising a first water blocking layer disposed between the OLED device and the first layer, and a second water blocking layer disposed on the first layer.

7. The packaging structure according to claim 6, wherein at least one of the first layer, the first water blocking layer, and the second water blocking layer has an extending portion at its corner position.

8. The packaging structure according to claim 7, wherein a shape of the extending portion of said at least one of the first layer, the first water blocking layer, and the second water blocking layer comprises one of an arc, a semicircle, a rectangle and a square.

9. The packaging structure according to claim 6, further comprising at least one second layer, at least one third water blocking layer and at least one second blocking layer positioned outside the at least one second layer and defining the second layer.

10. The packaging structure according to claim 6, wherein:
the substrate is a flexible substrate;
the OLED device is an AMOLED device;
the first water blocking layer and the second water blocking layer are inorganic water blocking layers; and
the first layer is an organic planarization layer.

11. The packaging structure according to claim 6 further comprising a plurality of second layers and a plurality of third water blocking layers disposed alternately with each other.

12. A method for packaging an OLED device, the method comprising:
disposing the OLED device on a substrate;
forming a first layer on the OLED device by an inkjet process; and
forming a first blocking layer outside the first layer and defining the first layer, wherein the first blocking layer includes an extending portion bulging outwardly at a corner position, and wherein the extending portion bulges outwardly relative to a portion of the first blocking layer that is not located at the corner position.

13. The method according to claim 12, wherein a maximum half-length of the extending portion of the first blocking layer to between about 0.03 mm and about 0.3 mm.

14. The method according to claim 13, wherein the maximum half-length of the extending portion of the first blocking layer to between about 0.05 mm and about 0.15 mm.

15. The method according to claim 12, wherein the first layer has a first slope shape at a position corresponding to a corner of the OLED device and a second slope shape at a position corresponding to an edge of the OLED device, wherein a width of the first slope shape is greater than a width of the second slope shape, and wherein a difference between the width of the first slope shape and the width of the second slope shape is in a range from about 0.03 mm to about 0.3 mm.

16. The method according to claim 15, wherein the difference between the width of the first slope shape and the width of the second slope shape is in a range from about 0.05 mm to about 0.15 mm.

17. The method according to claim 12, further comprising:

forming a first water blocking layer between the OLED device and the first layer; and forming a second water blocking layer on the first layer.

18. The method according to claim 17, wherein at least one of the first layer, the first water blocking layer, and the second water blocking layer is formed with an extending portion in its corner position.

19. The method according to claim 18, wherein a shape of the extending portion of said at least one of the first layer, the first water blocking layer, and the second water blocking layer comprises one of an arc, a semicircle, a rectangle and a square.

20. The method according to claim 17, further comprising forming at least one second layer on the second water blocking layer, at least one third water blocking layer on the at least one second layer, and at least one second blocking layer positioned outside the at least one second layer and defining the second layer.

\* \* \* \* \*